US005729221A

United States Patent [19]

Krolopp et al.

[11] Patent Number: 5,729,221

[45] Date of Patent: Mar. 17, 1998

[54] KEYPAD CONFIGURATION

[75] Inventors: Rudy Krolopp, Lake Zurich; Dominic Errichiello, Roselle; Thomas C. Reardon, deceased, late of Marengo, all of Ill., by Mary Ann K. Reardon, Legal Representative

[73] Assignee: Motorola, Inc., Schaumburg, Ill.

[21] Appl. No.: 625,382

[22] Filed: Apr. 1, 1996

[51] Int. Cl.[6] .................... H03K 17/94

[52] U.S. Cl. .................... 341/22; 341/34; 200/5 A

[58] Field of Search .................... 341/20, 21, 22, 341/23, 24, 34, 176, 190; 400/489; 200/5 A; 379/422, 433, 110

[56] References Cited

U.S. PATENT DOCUMENTS

| | | | |
|---|---|---|---|
| 3,937,939 | 2/1976 | Frenkel | 364/708.1 |
| 4,086,654 | 4/1978 | Ido et al. | 364/709.11 |
| 4,388,509 | 6/1983 | Ullman et al. | 200/157 |
| 4,916,262 | 4/1990 | Jungels-Butler et al. | 200/5 A |
| 5,274,217 | 12/1993 | Kilian | 200/5 A |
| 5,302,970 | 4/1994 | Lakso et al. | 341/22 |
| 5,334,976 | 8/1994 | Wang | 341/22 |

FOREIGN PATENT DOCUMENTS

| | | |
|---|---|---|
| 0766275 | 4/1997 | European Pat. Off. . |
| 1444296 | 7/1976 | United Kingdom . |
| 1552444 | 9/1979 | United Kingdom . |
| 2062304 | 5/1981 | United Kingdom . |
| 2234115 | 1/1991 | United Kingdom . |

OTHER PUBLICATIONS

Zenith AVI MTS Stereo Color TV Operating Guide and Warranty product brochure; 1993.

Magnavox AZ 2615 Portable CD Mini System Operating Manual product brochure; Dec. 1994.

*Primary Examiner*—Jeffery Hofsass
*Assistant Examiner*—Andrew Hill
*Attorney, Agent, or Firm*—Sylvia Chen

[57] ABSTRACT

A keypad configuration for an electronic device has a housing (180) with one or more push buttons (110) having centers (113), a maximum radius (115), and a maximum height (215). A specific area (118) surrounds each push button and has a minimum radius (129) that is at least five times as long as the maximum radius of the push button or at least three times as long as the maximum height of the push button. No additional push buttons are within this specific area. The size, height, and spacing of the push buttons provide a point contact sensation to a user's fingertip, which prevents a user from pressing more than one key at a time and provides space for alphanumeric labels beside each push button. This keypad configuration is particularly suited for portable electronic devices where a small keypad is desirable, such as cellular telephones.

9 Claims, 3 Drawing Sheets

KEYPAD CONFIGURATION

FIELD OF THE INVENTION

This invention relates generally to portable electronic devices, and more particularly to a keypad configuration for an electronic device.

BACKGROUND OF THE INVENTION

With the development of smaller and lighter electronic devices for portable use, keypads are becoming more compact with individual keys more tightly spaced, taking less surface area, and having smaller numbers and letters printed on top. Unfortunately, users of these electronic devices sometimes experience difficulty in reading or pressing keys that are small and placed close together; users press more than one key at a time or press a wrong key. This drawback exists for users of cellular telephones and other portable electronic devices with keypads. Sometimes, a user cannot easily read the letters and numbers on a keypad of a telephone or other electronic device, especially in dim light. Also, users sometimes find alphanumeric keys on the keypad too small and crowded together to allow quick, accurate depression. Thus, there exists a need for a keypad configuration that promotes accurate depression of one key at a time.

DETAILED DESCRIPTION OF THE INVENTION

A keypad configuration facilitates accurate keypresses through an enhanced key height, small key surface area, and large spacings between keys to provide significant tactile feedback to a user. The dimensions of a key generate a point contact sensation with a user's finger, and the spacing of the keys allows a user to depress only one key at a time. Also, instead of printing a number or letter on the surface of a small key, an alphanumeric label is provided in the large spacing area between the keys on the telephone housing and illuminated, thus improving visibility of the numbers and letters. This keypad configuration can be used on cellular telephone keypads or any electronic device where a small keypad is desirable.

Figure 1:
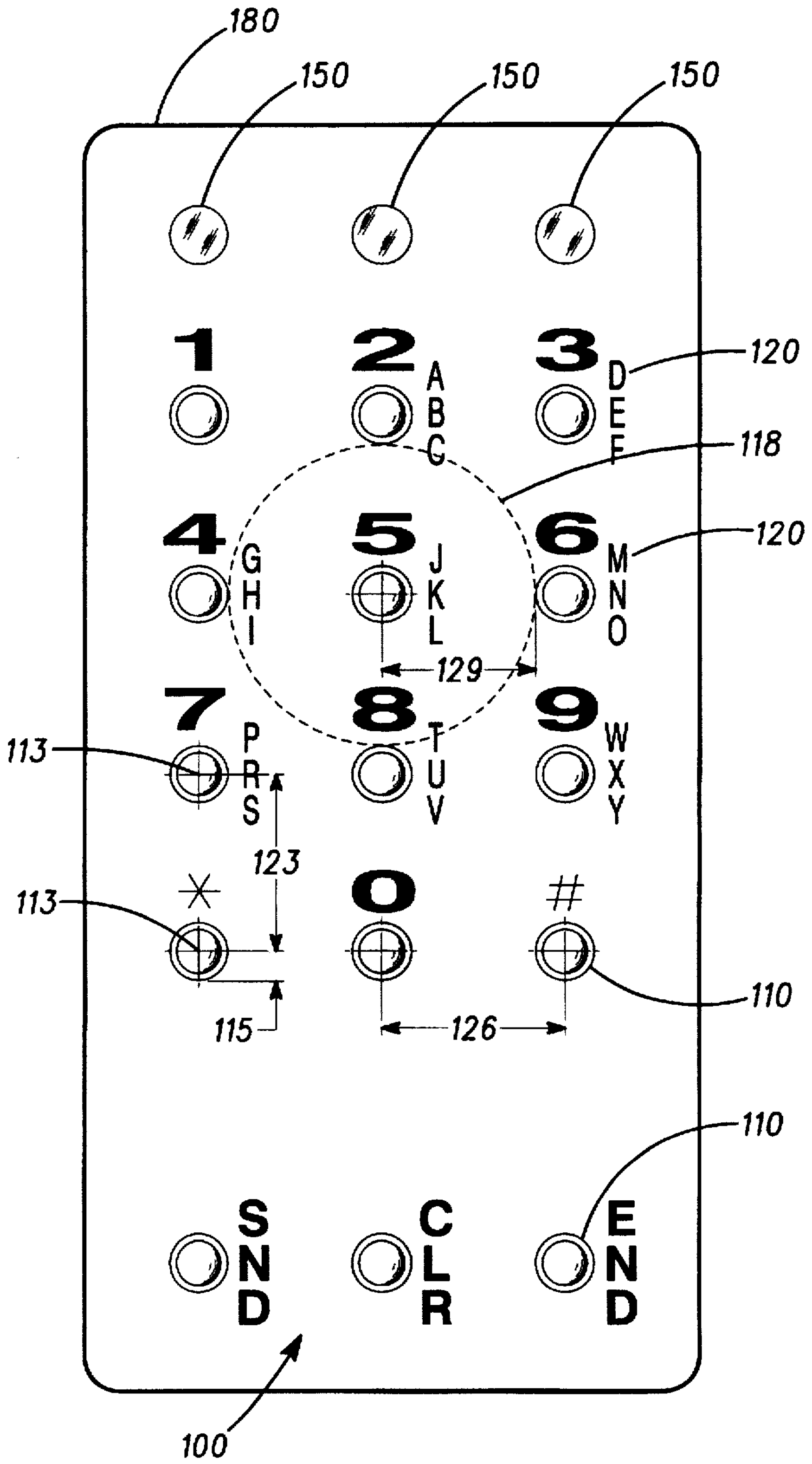
FIG. 1 shows a front view of a keypad according to a preferred embodiment.

FIG. 1 shows a front view of a keypad according to a preferred embodiment. Keypad 100 includes one or more push buttons 110 and one or more alphanumeric labels 120 in a housing 180 preferably constructed of molded plastic. The vertical distance 123 between the centers 113 of two adjacent push buttons is approximately 0.3125 inches. The horizontal distance 126 between the centers of two adjacent push buttons also is approximately 0.3125 inches. Alphanumeric labels 120 are provided directly on the housing 180 in the area above each push button and preferably illuminated using backlighting. Light-emitting diodes 150 of various colors provide visual feedback information to a user regarding features such as battery power, radio signal strength, or menu function currently in use.

The push buttons 110 are constructed to produce a point contact sensation in a user's fingertip to provide tactile feedback when the user presses a key. Thus, a circular button shape, reminiscent of Braille, is preferred. In this embodiment, the push buttons 110 are circular in shape with a maximum radius 115 of approximately 0.050 inches. With a circular push button, the maximum radius is equal to the minimum radius. Other shapes having maximum radii that are different from minimum radii, such as square, oval, and diamond, are acceptable alternatives to the circular shape.

The buttons are spaced such that a user's fingertip touches only one button at a time, thus removing the possibility of hitting two keys at once. A user's fingertip can be approximated by an oval having a maximum radius of approximately 0.250 inches. Thus, specific area 118 surrounding each push button, where no additional push button is situated, has a minimum radius 129 of 0.2625 inches measured from the center of the push button. This minimum radius of the specific area 118 surrounding the push button is more than five times the maximum radius 115 of a push button and accommodates the width of a user's fingertip, which aids in preventing the mistake of pressing more than one key at a time. This area also provides ample room to place large alphanumeric labels 120 on the housing 180 to reduce the mistake of pressing the wrong key due to an inability to read the alphanumeric label. The alphanumeric label is preferably backlit to enhance readability even in dim tight situations.

Figure 2:
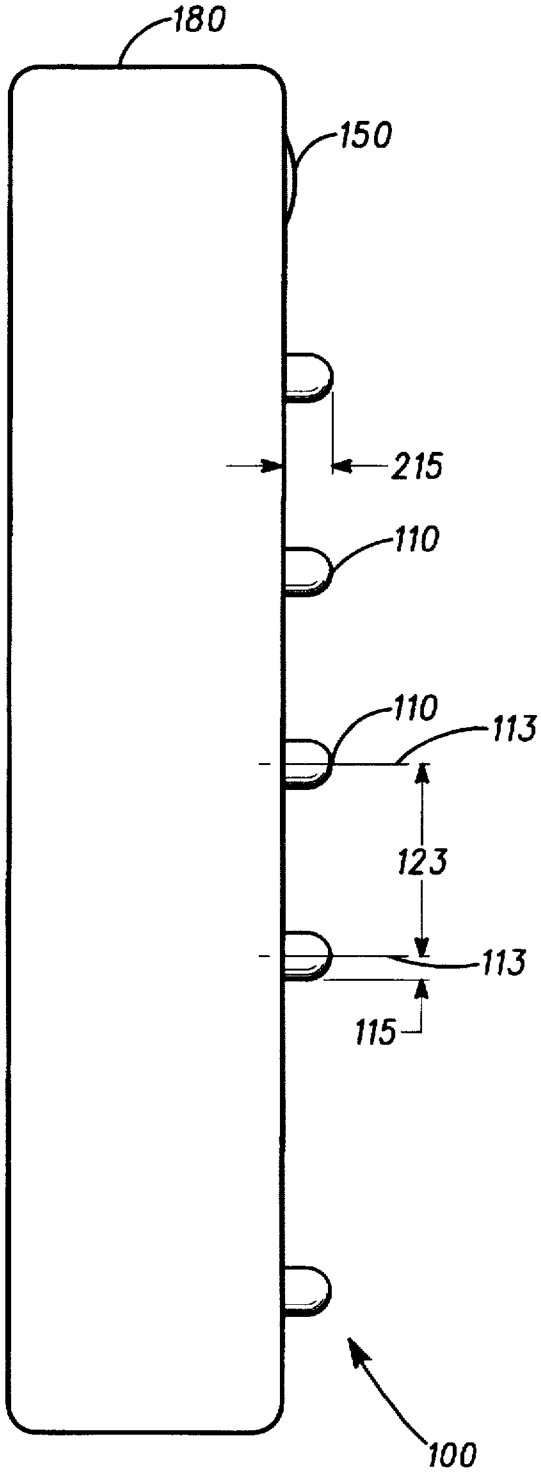
FIG. 2 shows a side view of a keypad according to a preferred embodiment.

FIG. 2 shows a side view of a keypad according to a preferred embodiment. The push buttons 110 protrude from housing 180 of the keypad 100. As described previously, the vertical distance 123 between centers 113 of adjacent push buttons is approximately 0.3125 inches, and the maximum radius 115 of each push button is approximately 0.050 inches. The maximum height 215 of a push button is approximately 0.100 inches, which allows for quick registry of a keypress by the electronic device and accurate tactile sensing of the key by a user's finger.

Figure 3:
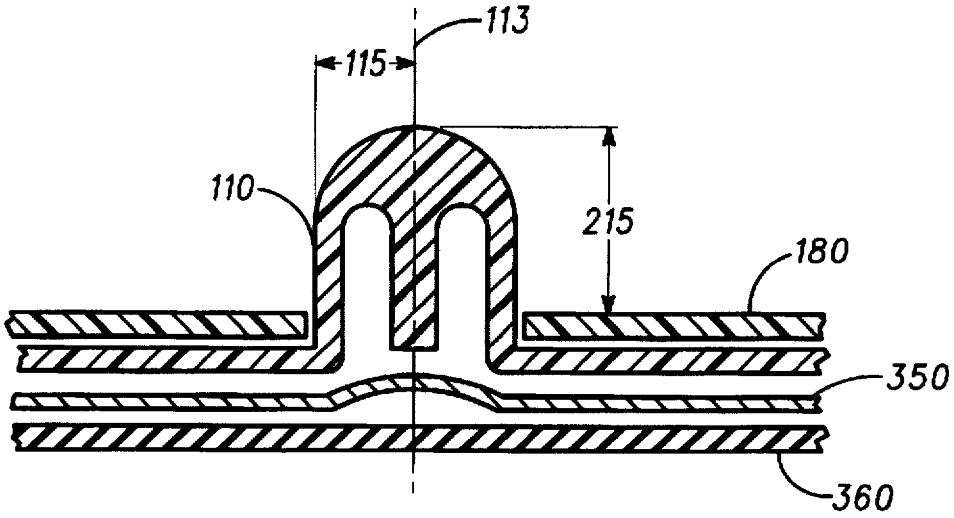
FIG. 3 shows a cut-away view of a push button according to a preferred embodiment.

FIG. 3 shows a cut-away view of a push button according to a preferred embodiment. Push buttons 110 are preferably constructed from injection-molded thermoplastic elastomer for one-piece construction flexural characteristics, long-life, backlighting capability, and a large range of hardness that may be needed to provide positive tactile feedback to the user. A dome-shaped button profile provides height and enhances the point contact sensation felt by a user's finger, however, other profiles such as rectangular, trapezoidal, inverted parabola, or semi-circular may be substituted. A mylar backing 350 is contacted when push buttons 110 are depressed and a signal is transmitted through circuit board 360.

Thus, the keypad configuration facilitates quick and accurate keypresses. While specific components and features of the keypad configuration are described above, modified components or features could be employed by one skilled in the art within the true spirit and scope of the present invention. The invention should be limited only by the appended claims.

We claim:

1. A keypad configuration comprising:

a housing;

a push button having a center and a maximum radius situated in the housing; and a specific area of the housing surrounding the push button having a minimum radius measured from the center of the push button that is at least five times as long as the maximum radius of the push button, wherein no additional push button lies inside the specific area of the housing.

2. A keypad configuration according to claim 1 further comprising:

an alphanumeric label situated inside the specific area of the housing.

3. A keypad configuration according to claim 2 wherein the alphanumeric label is illuminated.

4. A keypad configuration according to claim 1 further comprising:

an additional push button situated outside the specific area of the housing.

5. A keypad configuration according to claim 1 further comprising:

a light-emitting diode situated in the housing.

6. A keypad configuration according to claim 1 wherein the maximum radius of the push button is approximately 0.050 inches.

7. A keypad configuration according to claim 1 further comprising:

a first additional pushbutton adjoining the specific area;

a second additional pushbutton adjoining the specific area;

wherein the pushbutton, the first additional pushbutton, and the second additional pushbutton are arranged along a line.

8. A keypad configuration comprising:

a housing;

an outwardly-projecting push button having a center and a maximum height situated in the housing;

a specific area of the housing surrounding the push button having a minimum radius measured from the center of the push button that is at least two-and-a-half times as long as the maximum height of the push button; and an illuminated alphanumeric label situated inside the specific area of the housing, wherein no additional push button lies inside the specific area of the housing.

9. A keypad configuration comprising:

a housing;

a push button having a center situated in the housing;

a specific area of the housing surrounding the push button having a minimum radius of at least 0.250 inches measured from the center of the push button; and an illuminated alphanumeric label situated inside the specific area of the housing, wherein no additional push button lies inside the specific area of the housing.

* * * * *